United States Patent [19]

Ito et al.

[11] Patent Number: 4,890,575
[45] Date of Patent: Jan. 2, 1990

[54] THIN FILM FORMING DEVICE

[75] Inventors: Hiroki Ito; Teruo Ina, both of Hyogo, Japan

[73] Assignee: Mitsubishi Denki Kabushiki Kaisha, Tokyo, Japan

[21] Appl. No.: 73,249

[22] Filed: Jul. 14, 1987

[30] Foreign Application Priority Data

Jul. 14, 1986 [JP] Japan .................................. 61-165141
Mar. 25, 1987 [JP] Japan .................................. 62-69035

[51] Int. Cl.$^4$ .............................................. C23C 16/48
[52] U.S. Cl. .................................... 118/723; 118/50.1
[58] Field of Search .................. 118/50.1, 723; 427/35, 427/38

[56] References Cited

U.S. PATENT DOCUMENTS 4,147,573 4/1979 Morimoto ........................... 148/175
4,161,418 7/1979 Morimoto ........................... 148/175
4,645,977 2/1987 Kurokawa et al. ............. 118/50.1 X

FOREIGN PATENT DOCUMENTS 2805247 8/1978 Fed. Rep. of Germany .

OTHER PUBLICATIONS

European Search Report, Application No. EP 87110160.6, Nov. 24, 1987.
Patent Abstracts of Japan, Unexamined Applications, C Field, vol. 9, No. 66, Mar. 26, 1985, The Patent Office Japanese Government, p. 157, 271, Abstract of Kokai-No. 59-200753.

Primary Examiner—Evan Lawrence
Attorney, Agent, or Firm—Sughrue, Mion, Zinn, Macpeak & Seas

[57] ABSTRACT

A thin film forming device comprises a vacuum tank held at the predetermined degree of vaccum; a substrate placed in the vacuum tank; internal tanks disposed in the vacuum tank and each having an opening opposite to the substrate; gas jet nozzles, one arranged in each of the internal tanks and connected with reactive gas sources outside the vacuum tank, for jetting reactive gases of different types toward the substrate through the openings of the internal tanks; and electron beam irradiation devices disposed close to a passage, through which the reactive gases jetted from the gas jet nozzles pass, for irradiating electron beams to the reactive gases.

18 Claims, 5 Drawing Sheets

THIN FILM FORMING DEVICE

BACKGROUND OF THE INVENTION

This invention relates to a device for cleaning substrates and for forming thin films utilizing a reactive gas.

With increasing progress of the semiconductor industry in recent year, there have been developed a variety of manufacturing methods for semiconductors. One of these methods is generally called the CVD method. The CVD method is in most cases used to form thin films on substrates by utilizing a chemical reaction at a high temperature. More specifically, polycrystalline thin films such as silicon (Si), silicon nitride ($Si_3N_4$) or silicon dioxide ($SiO_2$), for example, are manufactured.

Figure 1:
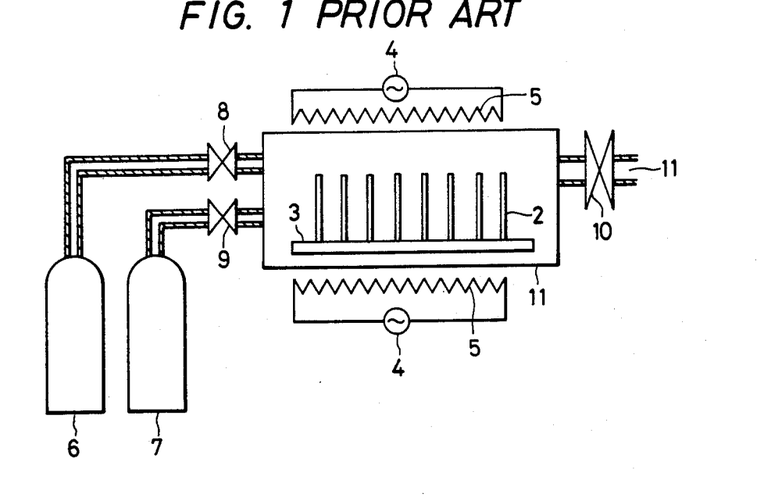
FIG. 1 is a schematic sectional view showing a conventional thin film forming device.

FIG. 1 is a schematic view of a conventional hot-wall type thin film forming device using a depressurized CVD method which is described in Solid State Tech., Apr. 63 (1977), pp. 63–70.

In the figure, designated at reference numeral 1 is a quartz reaction tube in which are disposed a plurality of substrates 2 and a substrate fixing member 3 adapted to fix these substrates 2 in parallel in the longitudinal direction at equal intervals. Introduced to the quartz reaction tube 1 are reactive gases from gas bombs 6, 7 through gas flow rate regulation valves 8, 9, respectively. At the same time, the reacted gas within the quartz reaction tube 1 is discharged by a vacuum exhaust system 11 through a gate valve 10. A heater 5 connected to an alternating current power supply 4 is arranged around the quartz reaction tube 1 to heat the substrates 2 in the quartz reaction tube 1 up to high temperatures on the order of several hundred °C. to several thousand °C., so that the chemical reaction of the reactive gases is caused on the substrates 2.

In running the conventional thin film forming device thus constructed, first the vacuum exhaust system 11 is operated to discharge the gas within the quartz reaction tube 1 and the gas flow rate regulation valves 8, 9 are regulated to allow reactive gases, e.g., silane gas ($SiH_4$) and oxygen gas ($O_2$), as well as carrier gases, e.g., argon (Ar and hydrogen ($H_2$), to flow into the quartz reaction tube 1 from the gas bombs 6, 7 through the gas flow rate regulation valves 8, 9, while depressurizing the interior of the quartz reaction tube 1 to the order of 0.1 mm Hg to 10 mm Hg. Then, the heater 5 is energized to heat the substrates 2 up to high temperatures on the order of several hundred °C. to several thousand °C., thereby effecting the chemical reaction (e.g., $SiH_4+2O_2 \rightarrow SiO_2+2H_2O$) of reactive gases on the substrates 2. Silicon dioxide produced as a result of the above reaction is deposited on the substrates 2 to form thin films thereof.

Figure 2:
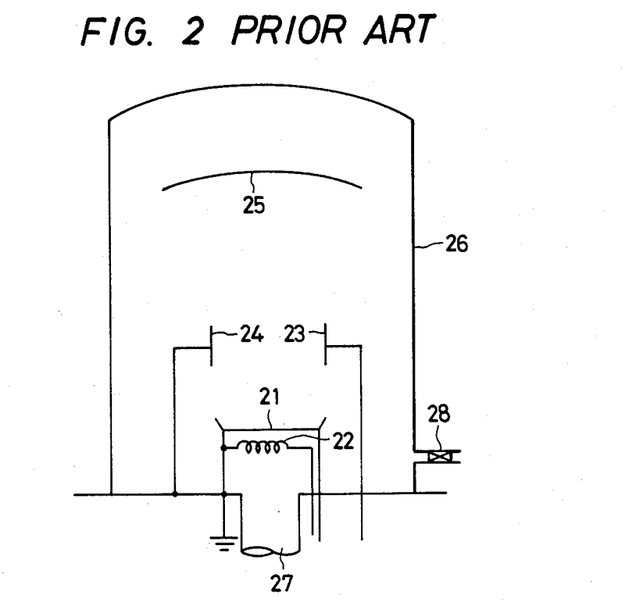
FIG. 2 is a schematic sectional view showing a conventional substrate cleaning device.

FIG. 2 is a schematic sectional view showing a conventional device for cleaning substrates which is described in Japanese Patent Laid-Open No. 55-9947(1980). In the figure, designated at reference numeral 21 is a boat, at 22 is a filament disposed underneath the boat 21 and connected thereto, at 23, 24 are electrodes disposed above the boat 21, and at 25 is a substrate holder disposed above the electrodes 23, 24 and mounting thereon substrates (not shown), such as vapor-deposited thin films, multilayer thin films or metal substrates, to be cleaned. At 26 is a vacuum tank containing the boat 21, the filament 22, the electrodes 23, 24 and the substrate holder 25, at 27 is an exhaust system for discharging the gas within the vacuum tank 26, and at 28 is a leak valve for introducing gas to the vacuum tank 26. Incidentally, while one end of the filament 22 and the electrode 23 are connected to a power supply (not shown), the boat 21, the other end of the filament 22 and the electrode 24 are connected to the vacuum tank 26 and then grounded as shown in the figure.

With the conventional substrate cleaning device thus constructed, first, substrates are mounted to the substrate holder 25 and the vacuum tank 26 is evacuated by the exhaust system 27 down to the range of $10^{-5}$ mm Hg. Then, hydrogen gas is introduced to the vacuum tank 26 through the leak valve 28 so that the gas atmosphere is set around $10^{-2}$ mm Hg. Then, when the filament 22 is energized for heating and a voltage is applied between the electrodes 23, 24, ionization discharge of the hydrogen gas occurs around the electrodes 23, 24 and the substrate holder 25 is in the area of the discharge. The substrates are bombarded by ionized hydrogen particles and the hydrogen ions reduce oxide films on the substrate surfaces for cleaning. At this time, a negative voltage may be applied to the substrate holder 25 to increase the cleaning effect.

In the thin film forming device as shown in FIG. 1, since thin films are formed on the substrates 2 through a chemical reaction under an atmosphere and at high temperatures, there arises a problem that the device cannot be applied to the formation of thin films at low temperatures where, for example, a plastic material is used as the substrate 2 and silicon dioxide ($SiO_2$) is formed as a thin film on the surface of the plastic material. Even if such a process can be performed, the rate of forming the thin films is low.

There is also a problem in that, when a carbon lubrication film is formed as the upper layer of a magnetic medium formed on a magnetic disc, for example, the previously formed magnetic medium may be destroyed because of the treatment at high temperatures.

Furthermore, in the conventional substrate cleaning device as shown in FIG. 2, if the gas pressure in the vacuum tank 26 is raised, the voltage applied between the electrodes 23, 24 is increased, or a negative voltage is applied to the substrates in order to increase the amount of ions reaching the substrates, instantaneous arc discharge is caused during the glow discharge and hence the substrates are damaged. Also, because the amount of ions reaching the substrate surface is concentrated at the center of the substrate, the device cannot be applied to uniformly clean a substrate of large area.

SUMMARY OF THE INVENTION

This invention has been made to solve the aforementioned problems, and an object thereof is to provide a device which is capable of forming thin films of excellent properties at a high rate even at low temperatures, i.e., according to a low temperature process.

Another object of this invention is to provide a device for cleaning substrates which is capable of efficiently ionizing a gas, uniformly cleaning a substrate surface of large area, as well as freely controlling the kinetic energy of the ions which are bombarded onto the substrate surface.

A thin film forming device according to a first embodiment of the invention comprises a single internal tank having an opening opposite to a substrate, a plurality of gas jet nozzles arranged in the internal tank for jetting reactive gases of different types, and electron beam irradiation means for irradiating electron beams into the reactive gases jetted from the gas jet nozzles.

A thin film forming device according to a second embodiment of the invention comprises a plurality of internal tanks each having an opening opposite to a substrate, a plurality of gas jet nozzles each arranged in each of the internal tanks for jetting reactive gases of different types, and a plurality of electron beam irradiation means for irradiating electron beams into the reactive gases jetted from the gas jet nozzles.

A thin film forming device according to a third embodiment of the invention comprises a vacuum tank and an internal tank, a gas jet nozzle arranged within the internal tank, the internal tank having a wall cut out at a location corresponding to a passage through which reactive gas jetted from the nozzle passes, a substrate disposed in the vacuum tank transversely to the direction of jetting of the reactive gas, an electron beam drawout electrode and an electron beam emission electrode both disposed along the passage of the reactive gas within the internal tank, and acceleration electrodes provided in the passage of the reactive gas within the internal tank and at the cut-out portion in the wall of the internal tank, so that thin films of excellent properties can be produced by utilizing the reactive gas.

A substrate cleaning device according to a fourth embodiment of the invention comprises a gas jet nozzle for jetting gas toward a substrate, and electron beam irradiation section for irradiating electron beams into the jetted gas to induce glow discharge, and an ion acceleration section for drawing ions out of the glow discharge to give the ions kinetic energy, causing the ions to uniformly bombard the substrate.

In accordance with the first, second and third embodiments of the invention, electron beams are irradiated into one or more reactive gases which are jetted from one or more gas jet nozzles within one or more internal tanks and contain specific elements different from one another, thereby producing an area in which the reactive gases are excited, dissociated and partially ionized, particularly near the substrate, to promote the chemical reaction so that a thin film of excellent properties is vapor-deposited on the substrate.

In practice, excitation, dissociation or ionization of the reactive gases principally occurs in a region of the internal tank and out of the internal tank where the reaction gases are present in the mixed form, as a result of which the generation of free elements and the deposition thereof onto the substrate take place advantageously.

Moreover, in accordance with the fourth embodiment of the invention, glow discharge is induced efficiently and stably in a high vacuum, the produced ions are bombarded uniformly onto the substrate, and the impact kinetic energy of the ions is changed depending on the circumstances, thereby permitting surface cleaning, surface sputtering, surface reformation, and ion implantation of the substrate.

DETAILED DESCRIPTION OF THE PREFERRED EMBODIMENTS

Figure 3:
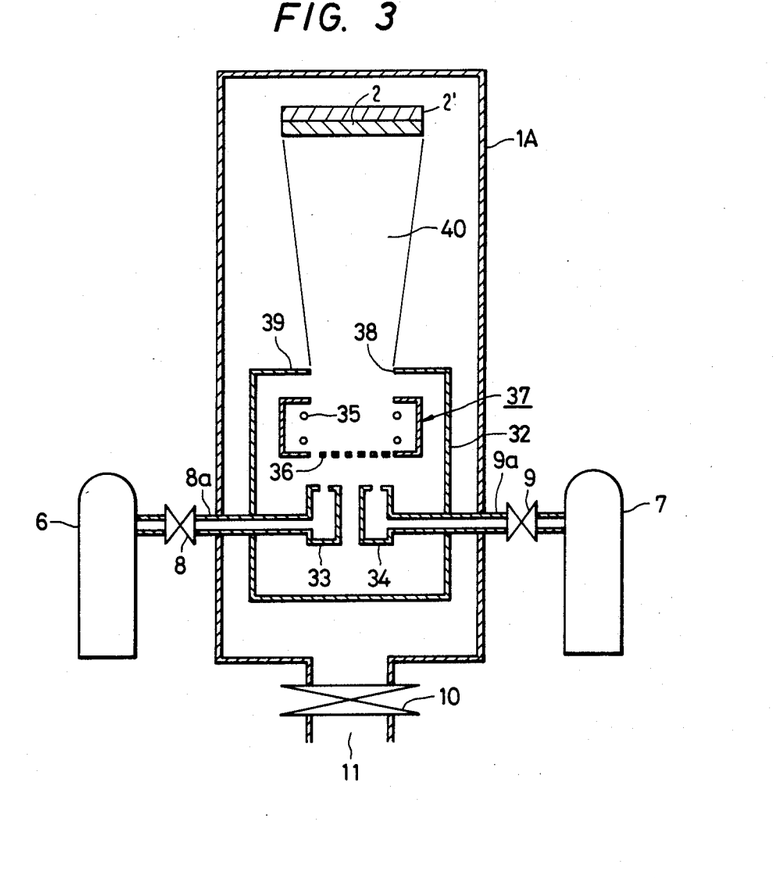
FIG. 3 is a schematic sectional view showing a thin film forming device according to a first embodiment of the invention.

FIG. 3 is a schematic sectional view showing a first embodiment of the invention in which reference numerals 2, 6 to 9 and 11 designate the same parts as those in the conventional device of FIG. 1. A substrate 2 is placed in a vacuum tank 1A on a support 2' and an internal tank 32 is disposed opposite to one side of the substrate 2. Within the internal tank 32, there are provided two gas jet nozzles 33 and 34 for jetting reactive gases different from each other into the internal tank 32. These gas jet nozzles 33, 34 are connected to gas bombs 6, 7 through supply pipes 8a, 9a, respectively, which serve as supply passages extended to the exterior of the vacuum tank 1A while penetrating through both the internal tank 32 and the vacuum tank 1A. Gas flow rate valves 8, 9 are fitted midway of the supply pipes 8a, 9a, respectively. Above the gas jet nozzles 33, 34, there is arranged electron beam irradiation means 37 which consists of an electron beam emission electrode 35 such as a filament, and an electron beam draw-out electrode 36 disposed between the electron beam emission electrode 35 and the gas jet nozzles 33, 34. When a voltage is applied between the electron beam emission electrode 35 and the electron beam draw-out electrode 36, electron beams are produced from the electron beam emission electrode 35 and irradiated into the reactive gases jetted from the electron beam jet nozzles 3, 34.

When passing through the electron beams produced by the electron beam irradiation means 37, the reactive gases jetted from the gas jet nozzles 33, 34 are activated upon irradiation. Further, when passing an opening 38 formed in an upper wall of the internal tank 32, the reactive gases are accelerated by an acceleration electrode 39 provided on the circumferential edge of the opening 38 so as to be jetted from the internal tank 32 onto the substrate 2.

With the thin film forming device thus constructed, in the case of using silane gas ($SiH_4$) and oxygen gas ($O_2$), for example, as reactive gases, these gases are introduced from the bombs 6, 7, respectively, and a thin film of silicon dioxide ($SiO_2$) is formed on the surface of the substrate in accordance with the following reaction:

$$SiH_4 + 2O_2 \rightarrow SiO_2 + 2H_2O \qquad (A)$$

In order to form such a thin film, the vacuum exhaust system 11 is first operated to hold the interior of the vacuum tank 1A at a predetermined high vacuum. The gas flow rate regulation valves 8, 9 provided midway of the supply pipes 8a, 9a communicating the gas jet nozzles 33, 34 with the gas bombs 6, 7, respectively, are then regulated to introduce the reactive gases (herein $SiH_4$ and $O_2$) into the vacuum tank 1A at a certain ratio from the gas jet nozzles 33, 34. At this time, the pressure in the vacuum tank 1A is held on the order of $10^{-5}$ mm Hg to $10^{-3}$ mm Hg, while the pressure in the internal tank 32 is held on the order of $10^{-2}$ mm Hg to $10^{-1}$ mm Hg.

On the other hand, by applying a voltage between the electron beam emission electrode 35 and the electron beam draw-out electrode 36, electron beams are emitted from the electron beam emission electrode 35 up to a maximum of approximately 5A. Since the electron beam draw-out electrode 36 is heated by the electron beams, the reactive gases passing through the electron beam draw-out electrode 36 are activated. Further, upon irradiation, SiH$_4$ and O$_2$ are excited, dissociated and partially ionized to form an area 40 wherein the gases are in an extremely activated state, before reaching the substrate. On this occasion, the gas pressure in the vacuum tank 1A is held lower than that in the internal tank 32, so that excitation, dissociation and ionization of the reactive gases are promoted in the area 40 outside the internal tank 32.

The ionized reactive gases are accelerated due to the electric field produced by the acceleration electrode 39 before reaching the substrate 2, and the foregoing reaction formula (A) occurs on the surface of the substrate 2 and a compound thin film is deposited on the substrate 2. Accordingly, crystallinity of the thin film formed on the substrate 2 can be controlled by regulating the kinetic energy of the ions jetted through the acceleration electrode 39 toward the substrate 2.

As described above, owing to the reactive gases being activated by the electron beams and also accelerated by the acceleration electrode 39, it becomes possible to efficiently form a thin film of excellent properties at a high rate even when using a low temperature process.

It is to be understood that, although the foregoing first embodiment has been described in connection with the case of including two gas jet nozzles 33, 34 within the single internal tank 32, three or more gas jet nozzles corresponding to the number of different reactive gases may be disposed within the single internal tank 32.

Figure 4:
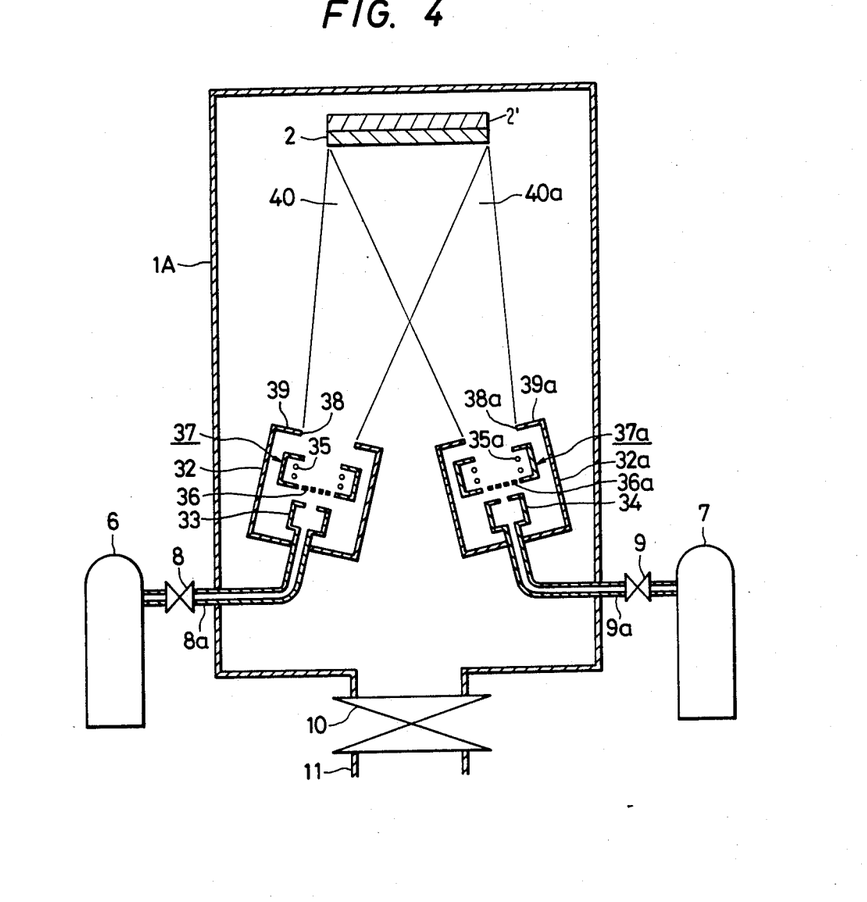
FIG. 4 is a schematic sectional view showing a thin film forming device according to a second embodiment of the invention.

FIG. 4 is a schematic sectional view showing a second embodiment of the invention in which reference numerals 1A and 32 to 40 designate the same parts as those in the foregoing first embodiment of FIG. 3. The thin film forming device of FIG. 4 is identical to that of FIG. 3 except that there are provided two internal tanks 32, 32a each having therein one of the gas jet nozzles 33, 34. The internal tanks 32, 32a include therein the gas jet nozzles 33, 34, electron beam irradiation means 37, 37a comprising electron beam emission electrodes 35, 35a and electron beam draw-out electrodes 36, 36a, and acceleration electrodes 39, 39a, respectively.

The thin film forming device thus constructed operates in a nearly like manner to the device shown in FIG. 3. In the case of using SiH$_4$ and O$_2$ as reactive gases, for example, these reactive gases are jetted from the gas jet nozzles 33, 34 into the internal tanks 32, 32a which are held at a similar degree of vacuum as in the first embodiment of FIG. 3. The jetted reactive gases are activated by the electron beam irradiation means 37, 37a to produce excited areas 40, 40a. The ionized reactive gases are accelerated by the acceleration electrodes 39, 39a and then reach the substrate 2. The reaction shown in above formula (A) proceeds on the surface of the substrate 2 and a thin film of SiO$_2$ is formed thereon.

In the thin film forming device of this embodiment, because of the independent control of the reactive gases jetted from the internal tanks 32, 32a, it is possible to freely change crystallinity and stoichiometric composition of the thin film formed on the substrate 2. Further, a thin film of excellent properties can be efficiently formed at a high rate even when using a low temperature process.

It is to be understood that, although the foregoing second embodiment has been described in connection with the case of providing two internal tanks 32, 32a each having one of the gas jet nozzles 33, 34, three or more similar internal tanks may be provided. By way of example, silane (SiH$_4$), hydrogen (H$_2$) and methane (CH$_4$) gases may be used as reactive gases to form a-Si$_{1-x}$C$_x$:H. Thus, a thin film containing three or more ingredient elements can also be formed efficiently and with excellent properties.

Figure 5:
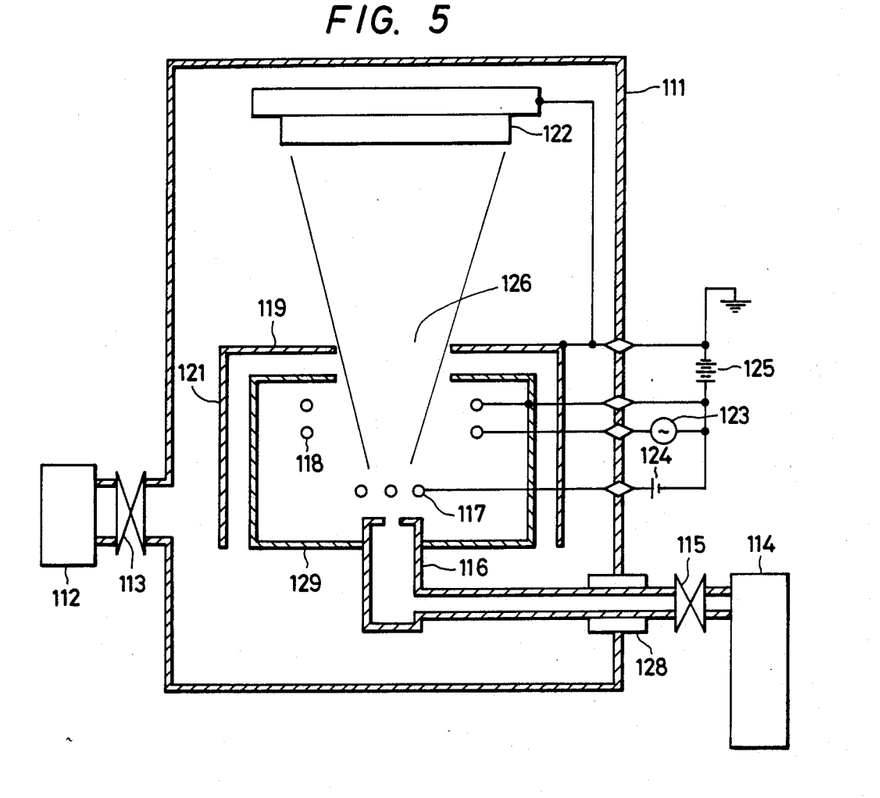
FIG. 5 is a schematic sectional view showing a thin film forming device according to a third embodiment of the invention.

FIG. 5 is a thin film forming device according to a third embodiment of the invention, in which designated at 111 is a vacuum tank, at 112 is an exhaust system for holding the vacuum tank at a high vacuum, at 113 is an exhaust valve, at 114 is a bomb of reactive gas, at 115 is a gas flow rate regulation valve, at 116 is a gas jet nozzle, at 117 is an electron beam draw-out electrode comprising a tungsten wire, at 118 is electron beam emission means comprising a filament, at 119 is an acceleration electrode, at 121 is an internal tank surrounding the entire ionizing chamber 129, at 122 is a substrate on which a thin film is to be formed, at 123 is an alternating current power supply for heating the filament 123, at 124 is a first direct current power source for holding the electron beam draw-out electrode 117 at a positive potential relative to the filament 118, at 125 is a second direct current power supply for applying voltage a between the acceleration electrode 119 and the ionizing chamber 129, at 126 is jetted gas, at 127 is an excited and ionized area of reactive gas, and at 128 is an insulating ceramic.

The operation and effect of this device will now be described.

By way of example, there will be described a case where hydrocarbon C$_x$H$_{2y}$ gas is used as a reactive gas to cause the reaction C$_x$H$_{2y}$→XC+YH$_2$ for forming a graphite film or diamond film.

First, the reactive gas 126 having its flow rate regulated by the gas flow rate regulation valve 115, which is provided midway of a line leading from the gas bomb 114, is introduced through the gas jet nozzle 116 to the interior of the vacuum tank 111 held by the exhaust system 112 at a high vacuum, so that the gas pressure in the vacuum tank 111 is adjusted to the order of $10^{-4}$ to $10^{-3}$ Torr.

Meanwhile, the first direct current power supply 124 is actuated to apply a voltage of 10 to 100 V so that electron beams on the order of 1 to 5 A are emitted from the electron beam emission means 118, heated by the alternating current power supply 123 up to approximately 2000° C., toward the electron beam draw-out electrode 17 disposed just above the gas jet nozzle 116.

Since the electron beam draw-out electrode 117 is heated with the electron beams, it activates the reactive gas 126 passing nearby.

Due to the heated electron beam draw-out electrode 117 and the aforementioned electron beams, the hydrocarbon gas, e.g., ethylene, is dissociated through the reaction C$_x$H$_{2y}$→XC+YH$_2$ and, at the same time, a part of the free carbon and hydrogen produced as a result of this reaction is excited and partially ionized upon collision with the electron beams.

With the gas pressure in the ionizing chamber 129 held higher than that in the vacuum tank 111, the dissociation reaction of the reactive gas is promoted when the electron beams are irradiated.

On the other hand, when a voltage on the order of 0 to several kV is applied between the acceleration electrode 119 and the ionizing chamber 129 by the second direct current power supply 125, the produced ions are caused to reach the substrate while being accelerated. By changing the acceleration voltage, it is possible to control the kinetic energy of carbon ions or hydrogen ions impinging upon the substrate. This permits control over the properties of a carbon film to be formed on the substrate: graphite, amorphous carbon and i-carbon film, and finally diamond film may be formed.

Although the foregoing third embodiment has been described in connection with the case of dissociating a hydrocarbon gas to form a carbon film, a SiN thin film or $SiO_2$ thin film may also be formed using a combination of silane gas and gas containing nitrogen elements, e.g., $SiH_4 + NH_3$, or a combination of silane gas and gas containing oxygen elements, e.g., $SiH_4 + N_2O$, as the reaction gas.

It is to be understood that, although the foregoing third embodiment has been described in connection with the case of applying a voltage of 10 to 100 V to the electron beam draw-out electrode to emit electron beams of the order of 1 to 5 A, a similar effect may be expected, even with the applied voltage above 100 V.

Figure 6:
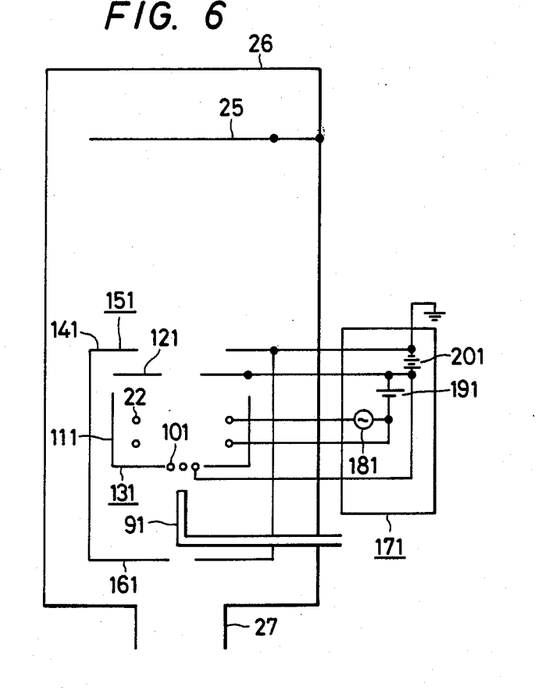
FIG. 6 is a schematic sectional view showing a substrate cleaning device according to a fourth embodiment of the invention.

FIG. 6 is a schematic sectional view showing a fourth embodiment in which the invention is applied to a substrate cleaning device, and reference numerals 22 and 25 to 27 designate the same parts as those in the conventional device shown in FIG. 2. Designated at reference numeral 91 is a gas jet nozzle for jetting a cleaning gas, at 101 is a grid disposed above the gas jet nozzle 91 for drawing out thermoelectrons, at 111 is an electric field shield plate surrounding both the grid 101 and a filament 22, at 121 is a grid electrode disposed above the electric field shield plate 111 and having a concentric hole bored at the center, at 131 is an electron beam irradiation section comprising the filament 22, the grid 101, the electric shield plate 111 and the grid electrode 121, and at 141 is an acceleration electrode disposed above the grid electrode 121 and constituting an ion acceleration section 151 together with the grid electrode 121. Designated at 161 is a shield plate for shielding the gas jet nozzle 91, the electron beam irradiation section 131 and the acceleration electrode 141. Designated at 171 is a power supply unit installed outside the vacuum tank 26, which includes an alternating current power supply 181 for heating the filament 22, a first direct current power supply 191 holding the grid electrode 121 at positive potential relative to the filament 22, and a second direct current power supply 201 holding the grid electrode 121 at positive potential relative to the acceleration electrode 141.

In the substrate cleaning device thus constructed, first cleaning gas is introduced from the gas jet nozzle 91 to a vacuum tank 26, which is evacuated by an exhaust system 27 to hold a high vacuum on the order of $10^{-6}$ mm Hg, and the gas pressure is regulated so that the vacuum tank 26 exhibits a gas pressure on the order of $10^{-4}$ to $10^{-3}$ mm Hg. At this time, the gas pressure in the central part of the device is held at degree of vacuum on the order of $10^{-3}$ to $10^{-2}$ mm Hg. The first direct current power supply 191 is then actuated to apply a voltage on the order of 10 to 200 V between the grid 101 and the filament 22, so that electron beams are emitted to the grid 101 from the filament 22 which is heated by the alternating current power supply 181 up to approximately 2000° C. By the voltage thus applied, electrons are emitted from the filament 22 on the order of 1 to 5 A to induce glow discharge in the cleaning gas, thereby producing plasma. Meanwhile, when the second direct current power supply 201 is actuated to apply a voltage on the order of several hundred to several thousand V between the grid electrode 121 and the acceleration electrode 141, ions in the plasma produced by the glow discharge are accelerated in a controllable manner and bombarded onto a substrate supported in a substrate holder 25. By changing the kinetic energy of those ions, various processes from surface cleaning to surface sputtering can be performed on the substrate. Use of nitrogen gas or oxygen gas instead of cleaning gas permits formation of a nitride film or oxide film on the substrate surface. It is also possible to carry out ion implantation and surface reformation such as reduction and removal of an oxide coating by the use of hydrogen gas. At this time, the current density of ions reaching the substrate surface can be made uniform by appropriately varying the gap between the grid electrode 121 and the acceleration electrode 141, as well as apertures of these electrodes.

Figure 7:
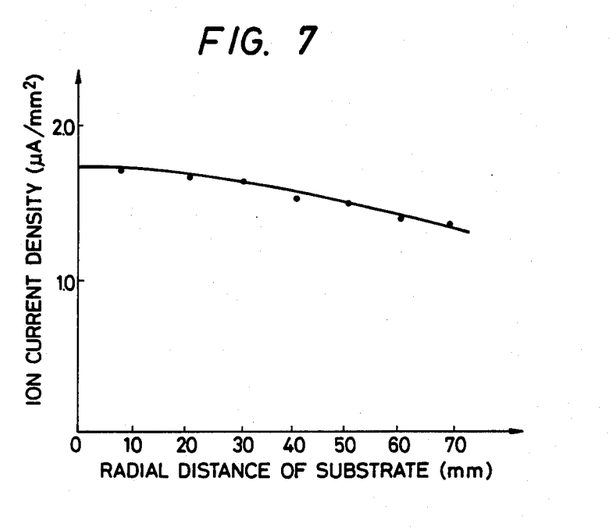
FIG. 7 is a plot showing the relationship between the ion current density and the radial distance of a substrate as measured in the fourth embodiment of the invention.

FIG. 7 is a graph showing the current density of ions reaching the substrate plotted with respect to the radial distance of the substrate (black dots in the figure representing the measured values) under conditions such that the gap between the grid electrode 121 and the acceleration electrode 141 is about 10 mm, the apertures of these electrodes are about $\phi 40$ mm and about $\phi 50$ mm, respectively, and an acceleration voltage of 3 KV is applied. It is found that, as compared with the case of employing neither the grid electrode 121 nor the acceleration electrode 141, the distribution of the ion current density over the substrate is more uniform in the device of the present invention employing both of these electrodes. Furthermore, as one practical example of the present device, argon gas was introduced from the gas jet nozzle to clean an aluminum substrate for 30 minutes and, thereafter, a chromium film was vapor-deposited on the cleaned substrate surface by a cluster ion beam method. The result of measurement using a pull-down technique showed that the adhesion force of the chromium film onto the cleaned substrate was not less than 400 $Kg/cm^2$. To the contrary, the adhesion force of the chromium film onto the aluminium substrate was around 200 $Kg/cm^2$ in the absence of such cleaning.

As described above, since the electron beam irradiation means and the ion beam acceleration means are combined in this invention, the following effects can be attained:

(1) the reactive gas can be dissociated efficiently and a high evaporation rate results;

(2) by changing the acceleration voltage, the properties of the thin film can be controlled to obtain the thin film of desirable properties; and (3) the thin film can be formed at lower temperatures than needed in the conventional CVD device.

In case of applying this invention to a substrate cleaning device, since the device includes the gas jet nozzle, the electron beam irradiation section and the ion acceleration section, glow discharge is induced efficiently and stably, the produced ions are bombarded uniformly onto the substrate, and the impact kinetic energy of the ions can be properly changed depending on circumstances, thereby resulting in an advantage that surface cleaning, surface sputtering, surface reformation and ion implantation of the substrate can be carried out effectively. It is also possible to improve characteristics of the thin film such as the adhesiveness of a film coated on a substrate subjected to surface cleaning.

What is claimed is:

1. A thin film forming device comprising: a vacuum tank for holding a predetermined degree of vacuum; means for supporting a substrate in said vacuum tank; an internal tank for holding a vacuum disposed in said vacuum tank and having an opening opposite to said substrate; a plurality of gas jet nozzles arranged in said internal tank and connected to a plurality of reactive gas sources located outside said vacuum tank, for jetting reactive gases of different types toward said substrate through said opening; and electron beam irradiation means disposed close to a passage through which the reactive gases jetted from sad gas jet nozzles pass, for irradiating electron beams into the reactive gases.

2. A thin film forming device according to claim 1, further including means for accelerating the reactive gases subjected to irradiation by said electron beams, provided between said electron beam irradiation means and said substrate.

3. A thin film forming device according to claim 2, wherein said acceleration means comprises an acceleration electrode provided at said opening of said internal tank.

4. A thin film forming device according to claim 1, wherein said electron beam irradiation means comprises an electron beam emission electrode and an electron beam draw-out electrode arranged in said internal tank and proximate each other.

5. A thin film forming device according to claim 4, wherein said electron beam draw-out electrode is disposed in the passage of the reactive gases jetted from said gas jet nozzles, for heating the reactive gases when the reactive gases pass therethrough.

6. A thin film forming device according to claim 1, wherein a gas flow rate regulation valve is fitted in each supply passage communicating said plurality of reactive gas sources with said plurality of gas jet nozzles.

7. A thin film forming device according to claim 1, wherein a degree of vacuum in the interior of said internal tank is lower than that in said vacuum tank.

8. A thin film forming device comprising: a vacuum tank for holding a predetermined degree of vacuum; means for supporting a substrate in said vacuum tank; a plurality of internal tanks for holding a vacuum disposed in said vacuum tank and each having an opening opposite to said substrate; a plurality of gas jet nozzles, one arranged in each of said internal tanks and connected with respective reactive gas sources located outside said vacuum tank, for jetting reactive gases of different types toward said substrate through said openings of said internal tanks; and a plurality of beam irradiation means, each disposed close to a passage through which the reactive gas from each of said gas jet nozzles passes, for irradiating electron beams into the corresponding reactive gases.

9. A thin film forming device according to claim 8, further including means for accelerating the reactive gases subjected to irradiation by said electron beams, provided between each of said electron beam irradiation means and said substrate.

10. A thin film forming device according to claim 9, wherein said acceleration means comprises an acceleration electrode provided at the opening of each of said internal tanks.

11. A thin film forming device according to claim 8, wherein each of said electron beam irradiation means comprises an electron beam emission electrode and an electron beam draw-out electrode arranged in each of said internal tanks and proximate each other.

12. A thin film forming device according to claim 11, wherein an electron beam draw-out electrode is disposed in the passage of the reactive gas jetted from each of said gas jet nozzles, for heating the reactive gas when the reactive gas passes therethrough.

13. A thin film forming device according to claim 8, wherein a gas flow rate regulation valve is fitted in each supply passage communicating said plurality of reactive gas sources with said plurality of gas jet nozzles.

14. A thin film forming device according to claim 8, wherein a degree of vacuum in the interior of each of said internal tanks is lower than that in said vacuum tank.

15. A thin film forming device comprising: a vacuum tank, an internal tank for holding a vacuum disposed in said vacuum tank; a gas jet nozzle arranged within said internal tank; said internal tank having a cut out located at a wall portion corresponding to a passage through which reactive gas jetted from said gas jet nozzle passes; means for supporting a substrate in said vacuum tank transversely to the direction of jetting of the reactive gas; an electron beam draw-out electrode and electron beam emission means, both disposed along said passage of the reactive gas within said internal tank; and acceleration electrode means provided in said passage of the reactive gas within said internal tank and at the cut-out in the wall of said internal tank.

16. A thin film forming device according to claim 15, wherein the gas pressure in said vacuum tank is in a range of approximately $10^{-4}$ to $10^{-3}$ Torr.

17. A thin film forming device according to claim 15, wherein said electron beam draw-out electrode comprises a tungsten wire and is supplied with a voltage on the order of 10 to 100 V using a direct current.

18. A thin film forming device according to claim 15, wherein said electron beam emission means comprises a filament and is supplied with an alternating current sufficient to heat the same up to about 2000° C.

* * * * *